(12) United States Patent
De Wijs et al.

(10) Patent No.: US 9,305,821 B2
(45) Date of Patent: Apr. 5, 2016

(54) APPARATUS AND METHOD FOR MANUFACTURING AN INTEGRATED CIRCUIT

(71) Applicant: KONINKLIJKE PHILIPS N.V., Eindhoven (NL)

(72) Inventors: Willem-jan A. De Wijs, Oss (NL); Marcus Johannes Van De Sande, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/222,888

(22) Filed: Mar. 24, 2014

(65) Prior Publication Data
US 2014/0206150 A1 Jul. 24, 2014

Related U.S. Application Data

(63) Continuation of application No. 13/258,105, filed as application No. PCT/IB2010/051295 on Mar. 24, 2010, now Pat. No. 8,707,896.

(30) Foreign Application Priority Data

Mar. 27, 2009 (EP) .................................... 09156417

(51) Int. Cl.
| H01L 21/70 | (2006.01) |
| H01L 21/28 | (2006.01) |
| B05C 9/14 | (2006.01) |
| H05K 3/12 | (2006.01) |
| H05K 3/10 | (2006.01) |
| H01L 31/0224 | (2006.01) |

(52) U.S. Cl.
CPC ...... *H01L 21/705* (2013.01); *H01L 31/022425* (2013.01); *H05K 3/10* (2013.01); *H05K 3/12* (2013.01); *H05K 3/1283* (2013.01); *H05K 2203/101* (2013.01); *Y02E 10/50* (2013.01)

(58) Field of Classification Search
None
See application file for complete search history.

(56) References Cited

U.S. PATENT DOCUMENTS

| 4,278,702 A | 7/1981 | Jenq |
| 4,461,785 A | 7/1984 | Oswald |
| 5,389,408 A | 2/1995 | De Volk |
| 5,837,356 A | 11/1998 | Katori et al. |
| 6,183,689 B1 | 2/2001 | Roy et al. |
| 2004/0179076 A1 | 9/2004 | Cohen et al. |

(Continued)

FOREIGN PATENT DOCUMENTS

| DE | 10041889 A1 | 3/2001 |
| DE | 19949458 A1 | 3/2001 |
| DE | 102006005026 A | 8/2007 |
| JP | 2122621 A | 5/1999 |

(Continued)

*Primary Examiner* — Dah-Wei D Yuan
*Assistant Examiner* — Jethro M Pence

(57) ABSTRACT

An apparatus for manufacturing an integrated circuit having a thick film metal layer includes an applicator configured to selectively apply a paste on a heat-conducting substrate. The paste includes particles of a first metal constituent of particles having sizes substantially within a narrow predetermined range about a predetermined size. The apparatus further includes a radio frequency (RF) generator to selectively inductively coupling RF energy into the paste. The first metal particles of the predetermined size are inductively couplable with the RF energy, and the frequency of the RF energy corresponds to a coupling frequency of the first metal particles of the predetermined size so that the inductive heating of the first metal particles is substantially maximized.

23 Claims, 7 Drawing Sheets

(56) References Cited

U.S. PATENT DOCUMENTS

| | | | |
|---|---|---|---|
| 2004/0188124 A1* | 9/2004 | Stark | 174/52.3 |
| 2005/0087226 A1 | 4/2005 | Nishida et al. | |
| 2007/0038950 A1 | 2/2007 | Taniguchi et al. | |
| 2008/0282537 A1 | 11/2008 | Lee | |
| 2009/0256558 A1 | 10/2009 | Fujita et al. | |

FOREIGN PATENT DOCUMENTS

| | | |
|---|---|---|
| JP | 2009513327 A | 4/2009 |
| JP | 2009186367 A | 8/2009 |
| JP | 2009252937 A | 10/2009 |
| WO | 2007038950 A | 4/2007 |

* cited by examiner

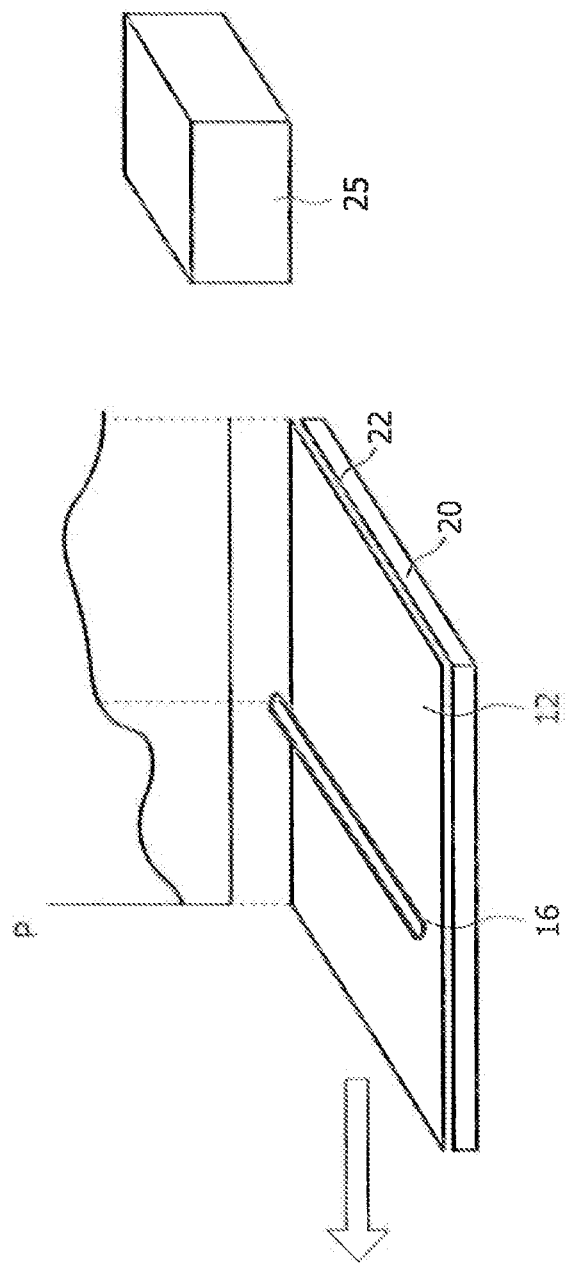

APPARATUS AND METHOD FOR MANUFACTURING AN INTEGRATED CIRCUIT

This application claims the benefit or priority of and describes relationships between the following applications: wherein this application is a continuation of U.S. patent application Ser. No. 13/258,105, filed Sep. 21, 2011, which is the National Stage of International Application No. PCT/IB2010/051295, filed Mar. 24, 2010, which claims the priority of foreign application EP09156417.9 filed Mar. 27, 2009, all of which are incorporated herein in whole by reference.

The present invention relates to an apparatus and method for manufacturing an integrated circuit having a thick film metal layer.

Present integrated circuits, such as solar cells for a solar panel, are currently manufactured by a process wherein a metal paste is applied to a substrate, and the entire assembly is heated in order to fuse, melt or sinter the metal particles in the paste and thereby create the desired circuitry. A sufficient amount of energy is applied to heat both the metal paste and the substrate up to the melting/sintering temperature of the metal. Beneficial interaction between the substrate and conducting material occurs at these high temperatures, but prolonged interaction decreases performance due to substrate damage and/or substrate property changes.

The limits in heating and cooling rate are normally governed by the heat power transfer to the total substrate with the metal paste. Conventionally, the total heat capacity of a substrate and metal needs to be considered to calculate a temperature increase for a given power input per second, and the heat capacity of, for example, a silicon substrate, is much larger than the heat capacity of the metal paste, e.g. a silver paste, arranged on the substrate. This heat capacity ratio ensures that much more power is needed, using the conventional methods, to get the same temperature increase over the same time period as if the metal were heated alone.

DE 100 41 889 A discloses a procedure for thermally changing the electrical properties of a semi-conducting coating material.

DE 102006005026A discloses an electrically conductive coating of sintered particles on a glass substrate. The sintered particles disclosed are nano-particles of ITO. The glass and ITO are heated capacitively in a resonant cavity using microwaves between 300 MHz and 30 GHz.

US Patent Publication 2005/0087226 discloses an electrode-arranging method for thin films on non-flat substrates. The method uses inductive heating in the range of several kHz to 1 MHz, which requires highly conductive, pre-sintered materials. The substrate and electrode material are both heated to the eutectic temperature of the substrate and electrode material.

SUMMARY OF THE INVENTION

An object of the invention is to provide an apparatus and method for rapid heating and cooling of a metal paste on a heat-conducting substrate for an electronic device having improved electrical performance and significant energy savings.

Another object of the invention is to provide a passive method of rapid cooling of a metal paste on a substrate, wherein the cooling rate is faster than with the active cooling methods used in the case of conventional infrared heating.

A further object of the invention is to provide a method for selectively coupling radio frequency (RF) energy with metal particles in a metal paste on a substrate, wherein only the heat capacity of the metal and the small energy losses to the surrounding substrate need to be considered, wherein significantly less power must be delivered to heat the metal very quickly to a desired temperature as compared to conventional methods.

A subsequent object of the invention is to provide a method for manufacturing an integrated circuit having a metal layer wherein the substrate itself is not heated to the melting/sintering temperature of the metal, wherein only the metal layer needs to be cooled.

In a first aspect of the present invention, an apparatus for manufacturing an integrated circuit having a thick film metal layer is proposed, including an application means for applying a layer of metal paste on a heat-conducting substrate, the metal paste having metal particles of a predetermined size, and an RF generator for selectively inductively coupling RF energy into the metal paste, wherein the metal particles of the predetermined size are selectively inductively couplable with the RF energy, the predetermined size of the metal particles corresponding to a coupling frequency of the RF energy, for heating the metal particles.

In a further aspect, a method for manufacturing an integrated circuit having a (sintered/molten) thick-film metal layer is proposed, including applying a layer of metal paste on a heat-conducting substrate, wherein the metal paste includes metal particles of a predetermined size, and selectively inductively coupling RF energy into the metal paste from an RF generator, wherein the predetermined size of the metal particles corresponds to a coupling frequency of the RF energy, and the metal particles of the predetermined size are selectively inductively couplable with the RF energy, for heating the metal particles.

The present invention provides an apparatus and a method for manufacturing an integrated circuit having a (sintered/molten) thick-film metal paste on a substrate. The method is accomplished in a fast and energy-efficient manner, due to selective inductive coupling of the metal particles in a metal paste on the substrate so that most of the inductive energy goes into heating the metal particles directly. The substrate may receive some energy from the metal particles, but is not coupled with the RF energy, or is coupled in a very limited manner, which results in a fast heating process which requires little energy, especially as compared to conventional processes.

The conventional processes require that the electrode material is first sintered before any heating step, whether inductive or capacitive, in order to create a highly conductive layer. At the low frequencies disclosed in the conventional art for inductive heating, the effect of the induction heating is very limited, and not very fast, in particular due to the requirement for heating both the electrode material and the substrate together. Further, in the case of conventional processes using capacitive heating with microwaves, a resonance cavity is required, due to the nature of capacitive heating and microwaves.

According to the present invention, pre-sintering of the electrode material is unnecessary because of the higher frequency which couples into the individual silver particles. The highly-conductive layer is not required at all. The efficiency of coupling is also greater. Because of this greater efficiency, the speed of heating is significantly higher than conventional technologies, including inductive heating done at lower frequencies.

A wide range of frequencies is known for use in capacitive heating processes, which are used to heat non-conducting materials as well as conducting materials. Inductive heating, for conducting materials, is a common technology at frequencies of several 10's or 100's of kHz. However, induction at a range of 2-200 MHz, or, in particular, about 27 MHz is not known because of a number of complications (such as electric breakdown due to the high voltage required, and controlling the heating process) that need to be dealt with, as described below.

At low frequencies, e.g. 10-1000 kHz, it is common to use a coil that is as large as the product to be heated. This is for a non-localized heating scenario. Occasionally, a smaller coil is chosen to increase the field strength that can be applied for more localized heating. Of course, in order to be effective, the conventional arts teach that the application of this low-frequency energy requires that the patterns to be heated, e.g. electrode material, is highly conductive. This requires that the electrode material is pre-sintered prior to inductive heating.

In the intermediate frequency range, e.g. 2-200 MHz, in particular 27 MHz, between the conventional inductive frequencies and microwaves, both a local and a non-local heating approach can be used. However, the use of a localized field, and a small coil, has strong advantages: better temperature field homogeneity can be achieved more easily, and the field strength can be much higher. Further, the coupling of the RF field to the individual metal particles in the metal paste means that pre-sintering is unnecessary. The present disclosure uses the RF field to sinter the electrode materials as they are selectively heated.

Low-frequency inductive heating, as provided in the conventional art, sets strict demands on the geometry of the electrode-material patterns on the substrate in order to control the temperature field and provide homogeneity. The presently disclosed heating arrangement is much less sensitive to the geometry of the patterns to be heated.

In contrast to the conventional art, the present disclosure uses a localized field from an RF generator that may be generated by a small coil. This arrangement has two important advantages:

Increased homogeneity of the heating process; and

Very high field strengths are possible without the use of extremely high voltages.

According to an embodiment, the substrate, due to its greater mass, has a higher heat capacity than the metal in the metal paste. This makes it possible for the substrate to act as a heat sink to provide rapid cooling of the metal layer.

According to a second embodiment, the substrate may include silicon, gallium-arsenic compounds, germanium, indium-tellurium compounds, and copper-indium-gallium-sulfur compounds. These materials provide the advantage of a large inductive heating efficiency difference (and heat capacity) difference between themselves and many of the metals used in integrated circuit manufacturing.

According to another embodiment, the substrate may act as a heat sink for rapidly cooling the selectively-coupled metal. The advantage of selectively coupling the metal on the substrate means that when a metal is selectively coupled, the substrate will remain relatively cool throughout the coupling period. Thus, a large capacity to absorb the temperature and energy differences between the substrate and the metal is available, wherein the metal may be cooled very rapidly.

According to a subsequent embodiment, the metal paste may comprise metal particles of silver, aluminum, copper, stainless steel and other conducting metals appropriate for use in integrated circuits. A wide variety of metals may be used to advantage depending on the intended application of the integrated circuit and the heat capacity of the substrate.

According to another embodiment, the metal particles in the metal paste are selectively coupled at a very high frequency in the range of 2 to 200 MHz. Selective coupling of the metals means that the substrate is not affected thermally in a direct manner and remains relatively cool with respect to the metal particles. The selected frequency range is higher and more effective in coupling than typical frequencies used for induction, and are significantly below the microwave frequencies, which require resonance cavities and extensive shielding. This frequency range provides sufficient energy to selectively couple metal particles in the metal paste, without over-penetrating the substrate materials or requiring extensive shielding arrangements, such as with microwaves. Some simple shielding may be required only to prevent disturbances in electronic appliances.

According to another embodiment, the metal particles of the metal paste are micro-particles, which are couplable with RF energy of about 27 MHz. This provides the advantage that a predetermined, uniform size of metal particles may be used with a narrowly-selected frequency band to provide controllable coupling without numerous undesirable considerations, e.g. over-penetration of the RF energy or excessive heating of the substrate. A properly sized particle complements nicely with a particular frequency band to provide a controlled method for manufacture. The micro-particles are larger than nano-sized particles, which would require microwave RF energy for coupling. Microwave RF energy would require a shielding arrangement to protect the surroundings.

According to a further embodiment, a substrate table may be provided to move the substrate having the metal paste under the RF generator at a predetermined rate, wherein the RF energy is distributed in a predetermined manner. This provides the advantage of uniform and controlled distribution of the RF energy, for selective heating or non-heating of the metal paste on the substrate. The RF energy may be modulated relative to the position of the substrate to enhance temperature homogeneity. It was observed that the heating under constant RF power and constant substrate speed was not homogeneous enough in the substrate movement direction, in some situations. The effect of heat conduction into the substrate caused a gradient in temperature increase when RF power was constant over the whole substrate travel length. This is caused by cooling in the first part, as a large, relatively cool substrate is available to act as heat sink, while in the last part, only a small piece of the substrate is relatively cool and the heat sink capacity of this piece is smaller. In one embodiment, modification of the RF power delivery is done by electrical or mechanical adjustment of the RF power output, controlled by signals indicating the substrate position. By adjusting the RF power to the coil while the substrate passes beneath it, the power loading can be "programmed" for each substrate position individually, enabling increased homogeneity or intended non-homogeneity.

According to a subsequent embodiment, the apparatus may include a substrate heater for pre-heating the substrate, wherein the conduction properties of the substrate are changeable with a temperature change. This provides the advantage of changing or manipulating the physical properties of the substrate, e.g. conduction properties, with the temperature increase. An advantage with this step is that a more conductive substrate, e.g. heated silicon, even when slightly heated, provides a more efficient heat sink arrangement for cooling the metal paste. In addition, the pre-heating step increases process stability. Silicon is non-conductive at low temperatures, and therefore does not heat up in the applied inductive field. At higher temperatures, however, it becomes conductive and starts to couple RF energy. When the silicon substrate is not pre-heated, the sudden change in the absorbing properties of the silicon can render the process uncontrollable, causing very inhomogeneous heating. In contrast, if the substrate is pre-heated to >400° C., the absorbing properties change very gradually, and can be accounted for in the process settings. The amount of energy absorbed per unit material is much less for silicon than for silver, even at this temperature, so the selective-heating principle is still fully applicable. This effect may also be significant if the substrate is a different semi-conductive material, for instance GaAs, Ge, InTe, CuInGaS or any other material with a band gap property.

According to a subsequent embodiment, the layer of metal paste is arranged with a predetermined three-dimensional geometry, wherein the temperature of the inductively-coupled metal particles is manipulable by the geometry. When the RF energy is carefully modulated, wherein the size of the metal particles in the metal paste is complementary with the RF energy frequency, a specific controllable penetration depth may be accomplished for the RF energy, and different temperatures may be achieved for different portions of the metal paste layer, depending on the predetermined three-dimensional geometry of the metal paste.

Also integrated circuits with multiple (2 or more) layers of thick film metal layers, with non-conductive layers in between, can be heated using the invention with RF heating. Connections with the 2 layers using vias are also possible.

BRIEF DESCRIPTION OF THE DRAWINGS

These and other aspects of the invention will be apparent from and elucidated with reference to the embodiment(s) described hereinafter. In the following drawings

FIG. 6 illustrates a perspective view of an apparatus for manufacturing an integrated circuit having an applied metal conductive paste, in accordance with an embodiment of the invention.

DETAILED DESCRIPTION OF THE INVENTION

Figure 1:
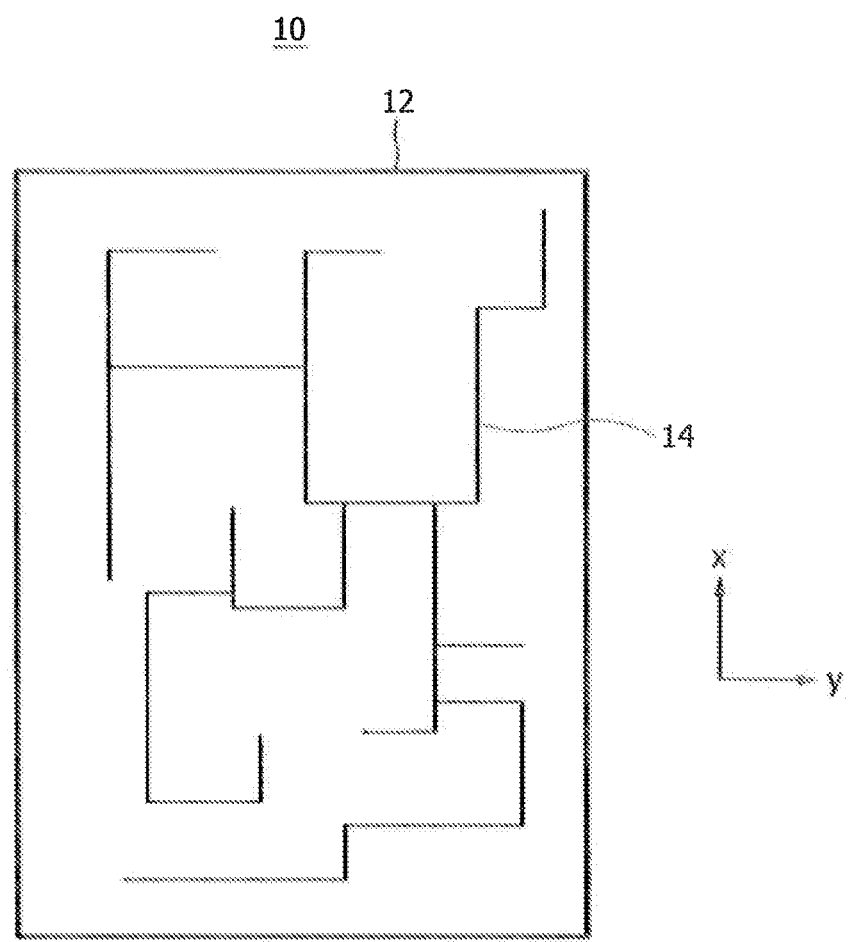
FIG. 1 illustrates a top view of a substrate for an integrated circuit having a pattern of a conductive metal paste thereon, in accordance with an embodiment of the invention.
Figure 2:
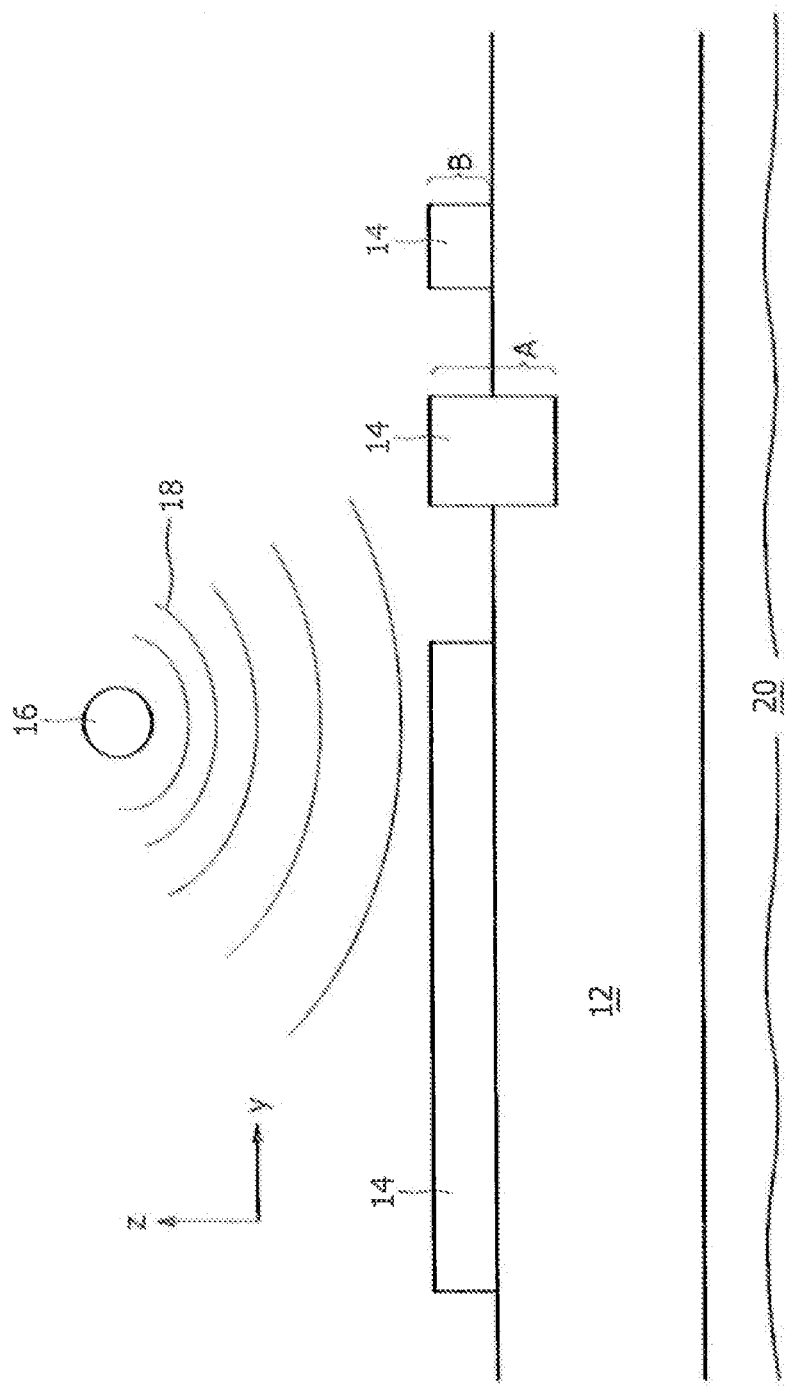
FIG. 2 illustrates a side sectional view of a substrate for an integrated circuit having an applied pattern of a metal conductive paste under an RF coil, in accordance with an embodiment of the invention.

FIG. 1 illustrates an arrangement of an integrated circuit 10 having a substrate 12 and an applied metal paste 14 arranged in a particular pattern. The thick film metal layer including the metal paste 14 is applied to the heat-conducting substrate 12 via an applicator 25, as shown in FIG. 6. The metal paste 14 includes metal particles of a predetermined size. As shown in FIG. 2, an RF generator 16, such as a coil, is used to selectively inductively couple RF energy (18) into the metal particles of the metal paste 14, in order to heat the metal particles.

The present invention provides an apparatus and a method for manufacturing an integrated circuit 10 having a thick-film metal layer including the metal paste 14 on a substrate 12. The method is accomplished in a fast and energy-efficient manner, due to the selective coupling of the metal particles in a metal paste 14 on the substrate 12 so that most of the inductive energy 18 goes into heating the metal particles directly. The substrate 12 may receive some thermal energy via heat conduction from the metal particles, but is not coupled, or is coupled only to a very limited degree in case of a pre-heated silicon substrate, with the RF energy, which results in a fast heating process which requires very little energy, especially as compared to conventional processes.

Figure 3:
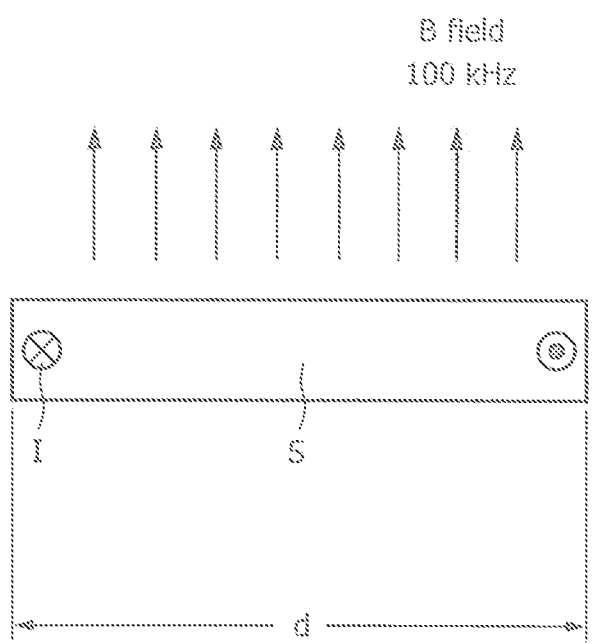
FIG. 3 illustrates a low-frequency induction-heating arrangement, in accordance with conventional methods.

The conventional processes require that the electrode material is first sintered before any heating step, whether inductive or capacitive, in order to create a highly conductive layer. At the low frequencies disclosed in the conventional art for inductive heating, the effect of the induction heating is very limited, and not very fast, perhaps due to the requirement for heating both the electrode material and the substrate together. Further, in the case of conventional processes using capacitive heating with microwaves, a resonance cavity is required, due to the nature of capacitive heating and microwaves. FIG. 3 illustrates the application of a low-frequency field, e.g. 100 kHz, to a layer of a sintered electrode material S having a thickness d. Due to the sintering process, the sintered electrode material S will exhibit an induction current I. The induction current I through the electrode material S causes heating of the electrode material S. Heating is the by-product of pre-sintering the electrode material S, the application of the low-frequency field and the induction of a current I in the electrode material S. This process takes too much effort and the same results can be achieved more easily via a different process.

Figure 4:
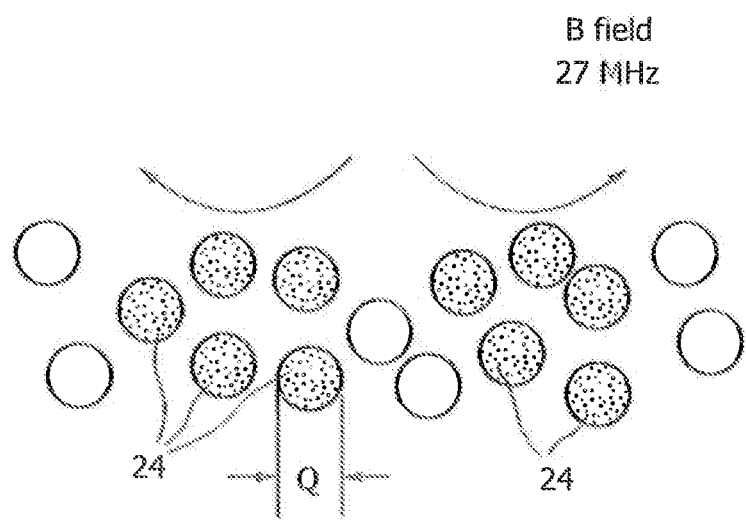
FIG. 4 illustrates a medium-frequency induction-heating arrangement, in accordance with an embodiment of the invention.

According to the present invention, and as illustrated in FIG. 4, pre-sintering of the electrode material is unnecessary because of the higher frequency, e.g. 2-200 MHz, field which couples into the individual metal, e.g. silver, particles 24 having a particle size Q. The particle size Q is typically much smaller than the thickness d of the electrode material of FIG. 3. As a result of the coupling of individual particles Q, the highly-conductive electrode layer S is not required at all. The efficiency of higher-frequency coupling of FIG. 4 is also greater than conventional processes. Because of this greater efficiency, the speed of heating is significantly higher than conventional technologies, including inductive heating done at lower frequencies.

The substrate 12 may have a higher heat capacity than the metal paste 14. Accordingly, the substrate 12 may be a heat sink to provide for rapidly cooling the selectively inductively-coupled metal paste 14. Rapid cooling complements the selective coupling, and selective heating, wherein relatively little energy is used to heat the substrate and a significant amount of energy is saved as compared to the conventional art.

The substrate 12 may be made from a number of materials including silicon, gallium-arsenic compounds, germanium, indium-tellurium compounds, copper-indium-gallium-sulfur compounds and other compounds or materials having heat capacities and conductive properties similar to the foregoing materials. A larger number of materials may be used with the disclosed method to manufacture integrated circuits and thick-film metal layers in a very energy-efficient manner.

The metal paste 14 may include a variety of metals, including silver, aluminum, copper and stainless steel, or other metals capable of being processed according to the disclosed method. A wide variety of metals having different properties may be used according to the disclosed method for producing integrated circuits or thick-film layers in an energy-efficient manner.

The metal paste 14 may be selectively coupled with the RF energy 18 at a very high frequency. The complementary RF frequency and metal particle size provide more controllability. According to another embodiment, the frequency of the RF energy 18 is around 27 megahertz. This particular frequency range provides the advantage of sufficient penetration of the metal paste 14 via coupling while avoiding the necessity for RF shielding, as would be the case for microwave energies.

The metal particles of the metal paste 14 are sized so as to be responsive to the RF energy 18. Appropriate selection of the RF energy 18 with a complimentary particle size results in efficient, selective heating of the metal particles in the metal paste 14, without excessive heating, and associated energy waste, in the substrate 12. In a further embodiment, the metal particles are micro-particles, e.g. 5-50 µm, which are responsive to RF energy 18 in the range of 2-200 MHz, in particular about 27 MHz. However, the particles may be even larger than 50 µm, depending on the particular metal selected. The microparticles may be about 12 µm diameter. The micro-particles are far larger than the nano-particles that would require the use of microwave energy-type frequencies and the corresponding shielding requirements. Thus, the combination of the micro-particles with a 27 megahertz frequency is both efficient and easily controlled.

As illustrated in FIG. 6, the substrate 12 having the metal paste 14 may be moved beneath the RF coil 16 at a predetermined rate. This arrangement provides for even distribution of the RF energy 18 from the RF coil 16 into the metal paste 14.

Figure 5:
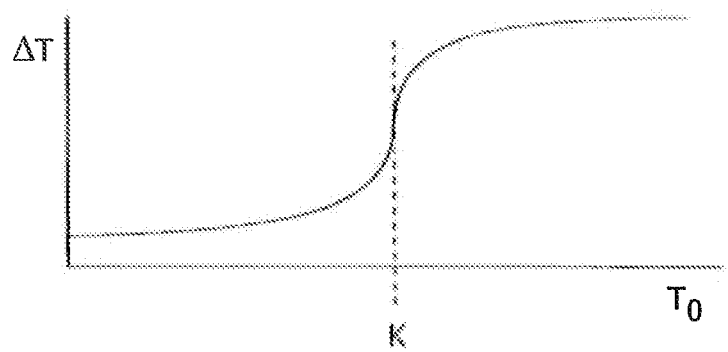
FIG. 5 illustrates a temperature-change curve for a substrate, in accordance with an embodiment of the invention.

The substrate 12 may be preheated to effect a change in the conduction properties of the substrate 12. Certain materials exhibit significant changes in their conductive properties with changes in their temperature, e.g. silicon, as illustrated in FIG. 5. FIG. 5 illustrates that the temperature change $\Delta T$ of the substrate 12 due to passing through the RF field depends on the initial temperature $T_0$ of the substrate 12. For the example of a silicon substrate, the characteristic temperature K is about 400° C. That is, the temperature at which the conductive properties have changed to the point where they can be used effectively to advantage is about 400° C. Below about 400° C., the characteristic, e.g. conductive, properties are not very great. With respect to silicon, at about 400° C., the RF energy coupled into the silicon equals the heat loss via conduction/convection. Thus, above this characteristic or "critical" temperature, the RF field can induce a significant temperature increase, while below this temperature it cannot.

Thus by raising the temperature of the substrate 12 to a point above the characteristic temperature K, the increase of- and stability of-conduction of the substrate 12 results in a more efficient heat sink arrangement of the substrate 12 with respect to the selectively-coupled, e.g. selectively-heated, metal paste 14. That is, when the substrate materials are appropriately selected and matched to the metal paste layer 14, the heated substrate 12 is better and more constant at absorbing the thermal energy of the metal paste 14 than when the substrate 12 is cool.

FIG. 6 illustrates an apparatus for manufacturing an integrated circuit with a thick-film metal layer having a substrate table 20 to support the substrate 12. The substrate table 20 may be used to move the substrate 12 under the RF generator 16 at a predetermined rate, for the application of RF energy in a predetermined manner. In addition, the apparatus may include a substrate heater 22 for pre-heating the substrate 12 in a manner to take advantage of the change in conductive properties of the substrate 12 above its characteristic temperature K. By modulating the RF power to the RF generator 16 as the substrate 12 passes beneath it, the power loading P, or programmable power wave form, can be determined and applied for each position of the substrate 12. This may be used to achieve improved homogeneity of non-homogeneity of RF application, and resultant temperature, as desired.

The layer of metal paste 14 may be arranged on the substrate 12 with a predetermined three-dimensional geometry, as shown in FIG. 2, wherein the temperature of the coupled metal paste 14 may be manipulated as a result of the geometry. The RF energy necessary for coupling with the metal paste 14 is calculable so that it is not excessive with respect to over-penetration of the metal paste 14, and will penetrate the metal paste 14 to a desired depth. Various heating and cooling arrangements of the metal paste 14 in particular areas of the substrate 12 may be created through various geometries, e.g. thicknesses, widths and lengths, of the applied metal paste 14 on the substrate 12 to achieve the desired conductive results.

In one example, the invention relies on selective coupling of the RF energy 18 into a metal paste 14 containing silver. In this case, only the heat capacity of the silver and the small energy loss to the surrounding substrate 12 needs to be considered for delivering RF energy, which results in a requirement for significantly less power to heat the silver very quickly to a desired temperature, via coupling, than would be required in conventional processes. However, once heated, the silver would need to be cooled quickly as well to prevent detrimental effects to the combined electrical properties of substrate and silver conductor. This problem is solved due to the selective coupling of the metal paste 14 via RF energy 18, in that the substrate 12 is not heated to high temperatures, so only the silver needs to be cooled.

The limits in heating and cooling rate are normally governed by the heat power transfer to the total substrate, including the metal paste 14. Conventionally, the total heat capacity of the substrate 12 and metal paste 14, e.g. silver, needs to be considered to calculate a required temperature increase for a given power input per second. The heat capacity of the substrate 12 in this example, e.g. silicon, is much larger than silver's heat capacity, which is present atop the substrate 12. This disparate ratio ensures that much more power is needed to heat the metal paste when conventional methods are used to achieve the same temperature increase in the same amount of time.

Conversely, roughly the same calculation can be applied in determining the necessary cooling power using conventional methods. Much more power is required to cool the substrate 12, e.g. silicon, when using conventional methods than if the metal paste 14, e.g. silver, is selectively coupled using RF power 18. As described above, the benefit in this case is that the substrate 12 itself acts as a heat sink to cool the metal paste 14 many degrees for every few degrees temperature increase in the substrate 12. This means that, effectively, the metal paste 14 on the substrate 12 can be cooled virtually instantly to the substrate's temperature.

These small dimensions of the silver particles Q, e.g. micro-particles, in the metal paste 14 may be selectively coupled only with very high RF frequencies in the range of 1-50 MHz, or in particular, about 27 MHz. The penetration depth of the RF energy 18 is governed by a formula:

$$\delta = 503\sqrt{(\rho/f^*\mu_r)}$$

The values used here are $\mu_r=1$, $\rho=16*10^{-9}$ Ωm, and $f=27*10^6$ Hz, wherein δ=penetration depth (m);
ρ=electric conductivity (Ohm m);
f=RF frequency (Hz); and
$\mu_r$=relative magnetic permeability.

An estimation based on this formula indicates that the penetration depth δ at 27 MHz is 12 micrometers, which is the same order of magnitude of the size of the silver particles in the metal paste 14 in this example. The relationship between the particle size and the RF frequency necessary for coupling is established such that particles/objects with a typical size that is much larger than the penetration depth will be heated. Generally, the particle size should be greater than six times the penetration depth of the RF field for optimal coupling. However, it is found that RF coupling will work for a particle size equal to penetration depth of the RF field. If the particle size becomes much smaller, the efficiency is reduced. Thus, there is an approximate lower limit to particle size, e.g. the penetration depth of the RF field.

Figure 8:
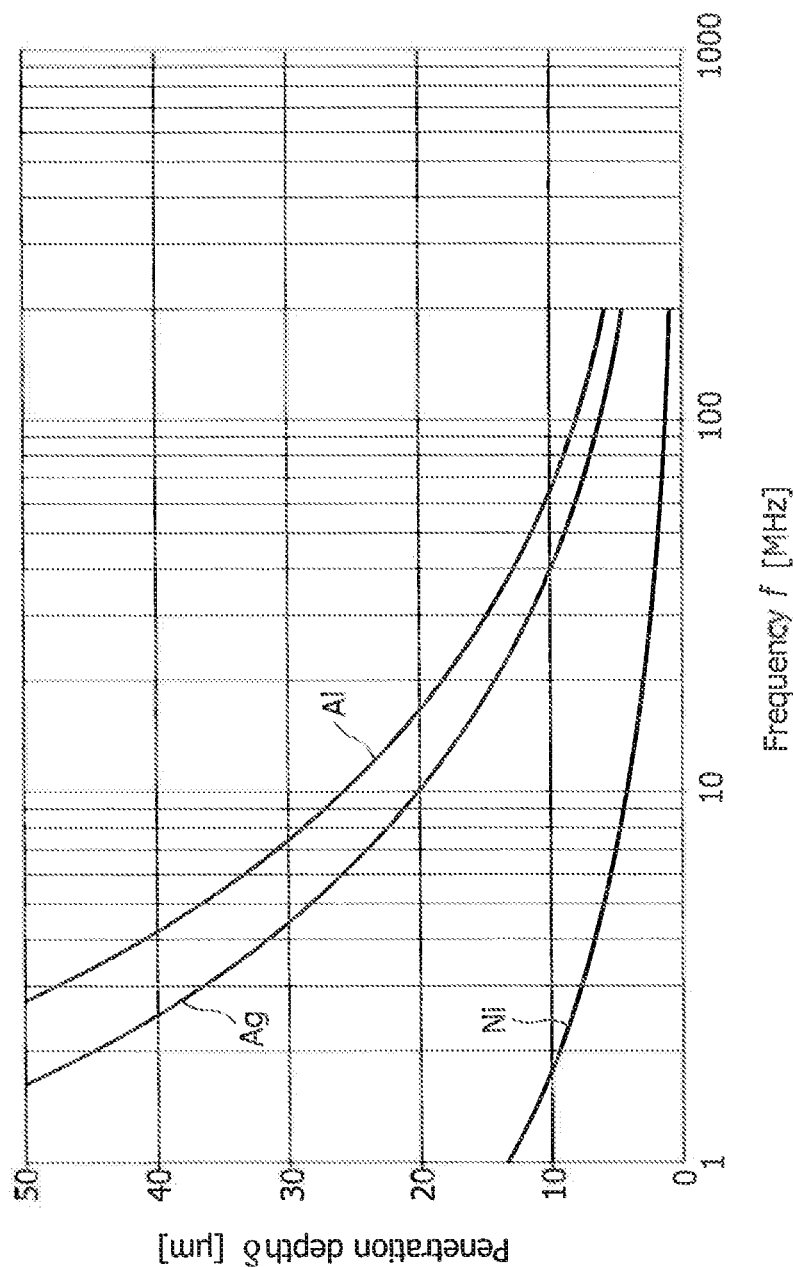
FIG. 8 illustrates the coupling frequencies and corresponding penetration depth for different metals, in accordance with an embodiment of the invention.

FIG. 8 illustrates the relationship between penetration depth δ and the RF frequency f for particles of silver, aluminum and nickel. The lower limit in particle size that can be heated inductively with a given frequency f is determined by the penetration depth, $\delta = 503\sqrt{(\rho/f^*\mu_r)}$, where ρ and $\mu_r$ are material properties. For given particle sizes, the frequency to be used is subject to a minimum, given by the same equation. For instance:

15 μm silver particles require a frequency of (more than) 18 MHz;

15 μm aluminum particles require a frequency of (more than) 30 MHz;

15 μm nickel particles require a frequency of (more than) 0.8 MHz;

10 μm silver particles require a frequency of (more than) 40 MHz; and

5 μm silver particles require a frequency of (more than) 160 MHz.

Individual excitation of the particles 24 via the RF field heats the metal particles 24 and sinters them together. The efficiency of RF penetration may be increased because of the additional electrical connections in the x and y direction, permitting higher currents to flow. A further insight is that the geometry of the metal paste 14 deposited on the substrate 12 can be used in modifying temperature distribution. FIG. 2 illustrates a side sectional view of a substrate 12 for an integrated circuit having an applied pattern of a metal paste 14 under an RF coil 16. When more metal paste 14 is present, e.g. when it is thicker, see element A of FIG. 2, the temperature of the metal paste 14 is reduced. Conversely, element B of FIG. 2 illustrates a thinner layer of the metal paste 14 which would heat more quickly in response to RF coupling. Similar effects may be created with distributions of the layers of the metal paste 14 in the x- and y-axes.

This principle can be used in specific types of solar cells, for example. This principle may also be used in other applications, wherein a metal layer may be used to shield sensitive parts of the structure from the RF field. Alternatively, a multilayer integrated circuit structure may be used, as illustrated in FIG. 7. A further insight is that the dimensions in the z axis, e.g. thickness, of the metal paste 14 are determining for the feasibility of the method, and that pre-sintering of the metal particles of the metal paste 14 increases the efficiency of the method.

A further insight is that the homogeneity of power transfer from the RF energy 18 into the metal particles of the metal paste 14, e.g. silver, is greatly enhanced by moving the substrate 12 beneath the RF coil 16 at a predetermined rate. The substrate may be moved at a steady or variable rate depending on the desired application of RF energy 18 to each part of the substrate 12 with metal paste 14.

A further insight is that the homogeneity of power transfer from the RF energy 18 into the metal particles of the metal paste 14, e.g. silver, is greatly enhanced by modifying the RF energy 18 dependent on the exact substrate position so that each part of metal paste 14 on substrate 12 reaches the same temperature, or a unique temperature desired for that part of the substrate 12.

Figure 7A:
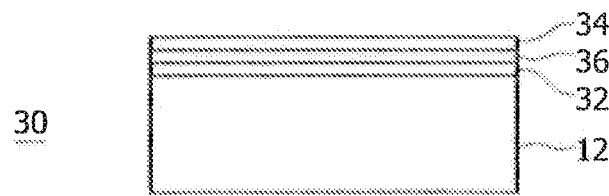
FIGS. 7A-7D illustrate top and side views of elements for a multi-layer integrated circuit having an applied metal paste, in accordance with an embodiment of the invention.
Figure 7B:
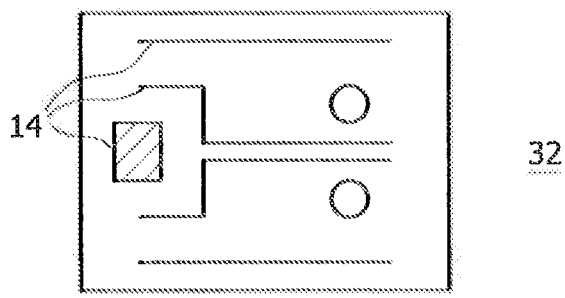
Figure 7C:
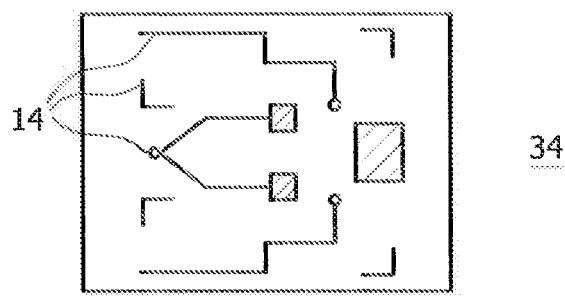

A multi-layered integrated circuit is illustrated in FIGS. 7A-7D. FIG. 7A illustrates a side view of a multi-layer integrated circuit arrangement 30 having two metal layers 32, 34 arranged on the substrate 12, as shown in FIGS. 7B and 7C. The first metal layer 32 and second metal layer 34 may include a metal paste 14, and are shown separated by an insulating layer 36. According to the present invention, the entire multi-layer integrated circuit arrangement 30 may be subjected to an inductive RF field for simultaneously coupling both the first and second metal layers 32, 34. According to the present teachings, the particle sizes for the metal paste 12 and the RF field strength and frequency should be selected to ensure sufficient penetration depth.

Figure 7D:
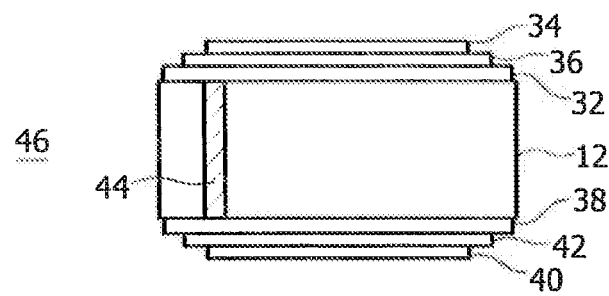

FIG. 7D illustrates an alternative embodiment of a multilayer integrated circuit arrangement 46 wherein the substrate 12 has two metal layers on each side. One side of the substrate 12 includes the first and second metal layers 32, 34, separated by the insulating layer 36. The opposite side of the substrate 12 includes third and fourth metal layers 38, 40, separated by an insulating layer 42. The substrate 12 may include a via 44 filled with metal particles. According to the present invention, the entire multi-layer integrated circuit arrangement 46 may be subjected to an inductive RF field for simultaneously coupling all of the metal layers 32, 34, 38, 40. The RF field may be provided from two sides of the substrate 12, simultaneously, so as to effectively inductively couple all of the metal layers 32, 34, 38, 40. The RF field couples less effectively into the via 44 due to the orthogonal orientation relative to the RF field, so temperature reached in the via is lower than within the 4 metal layers.

In this manner, the device and method disclosed provide an effective and inexpensive way in manufacture integrated circuits having a substrate within applied metal paste.

While the invention has been illustrated and described in detail in the drawings and forgoing description, such illustration and description are considered to be illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude the plurality. A single processor or other unit may fulfill the functions of several items recited in the claims. The mere fact that certain measures are recited and neutrally different dependent claims does not indicate that a combination of these measures cannot be used to advantage. Any reference signs in the claims should not be construed as limiting the scope.

The invention claimed is:

1. An integrated circuit manufacturing apparatus having a thick film metal layer comprising:

an applicator configured to selectively apply a paste on a heat-conducting substrate, the paste comprising particles of a metal constituent having sizes within a single predetermined range about a single predetermined size;

a radio frequency (RF) generator to selectively inductively coupling RF energy into the paste, wherein the metal particles of the single predetermined size range are inductively coupled with the RF energy, wherein a frequency of the RF energy corresponds to a coupling frequency of the metal particles of the single predetermined size range so that the inductive heating of the metal particles is maximized; and a substrate heater to pre-heat the substrate, wherein the substrate heater directly contacts the substrate.

2. The apparatus of claim 1, wherein the substrate has a higher heat capacity than the paste comprising the metal particles.

3. The apparatus of claim 1, wherein the substrate comprises a semi-conductive material comprising at least one of silicon, gallium-arsenide, germanium, indium-tellurium compounds and copper-indium-gallium-sulfur compounds.

4. The apparatus of claim 1, wherein the substrate is a heat sink for rapidly cooling the paste containing the metal particles.

5. The apparatus of claim 1, wherein the metal particles comprise at least one of silver, aluminum, copper stainless steel or a combination thereof.

6. The apparatus of claim 1, wherein the coupling frequency is in the range from 2 to 200 MHz.

7. The apparatus of claim 1, wherein the metal particles in the paste are sized in the range from 5 to 50 μm, so as to be inductively couplable with the RF energy.

8. The apparatus of claim 1, wherein the single predetermined range of particle size of the metal particles is within a range of 1 to 6 times a penetration depth of the RF energy in a material of the metal particles.

9. The apparatus of claim 1, comprising a substrate table to move the substrate having the paste under the RF generator at a predetermined rate, wherein the RF energy is distributed in a predetermined manner.

10. The apparatus of claim 9, wherein the predetermined rate is constant and wherein the predetermined manner is variable and linked to the substrate position.

11. The apparatus of claim 9, wherein the predetermined rate is variable and wherein the predetermined manner is constant.

12. The apparatus of claim 1, wherein conduction properties of the substrate are dependent on temperature.

13. The apparatus of claim 12, wherein the substrate heater is configured to pre-heat the substrate above 400° C.

14. The apparatus of claim 12, wherein the substrate material has a critical temperature below which the substrate is not inductively heated by the radio frequency (RF) for inductively heating the metal particles and above which the substrate is inductively heated by the radio frequency (RF) for inductively heating the metal particles to increase the temperature of the substrate during the inductive heating of the metal particles, the temperature increase of the metal particles being more than the temperature increase of the substrate during the inductive heating, and wherein the preheating heats the substrate above the critical temperature.

15. The apparatus of claim 1, wherein the applicator is configured to apply the paste onto the substrate with a predetermined three-dimensional geometry, wherein the temperature of the inductively-coupled metal particles of the paste is dependent on the geometry.

16. The apparatus of claim 1, wherein the coupling frequency is 27 MHz.

17. The apparatus of claim 1, wherein the single predetermined size of the particles of the metal constituent of the paste is selected to maximize the inductive heating of the particles.

18. The apparatus of claim 1, wherein the single predetermined size is 12 μm.

19. The apparatus of claim 18, wherein the single predetermined range is from 6 to 18 μm.

20. The apparatus of claim 1, wherein the single predetermined range is from 6 to 43 μm.

21. The apparatus of claim 1, comprising a substrate table to move the heat-conducting substrate having the paste under the RF generator, wherein the RF generator is controlled by signals indicating a position of the heat-conducting substrate.

22. The apparatus of claim 1, wherein the paste has a geometry including different portions having different thickness of the metal particles for heating the different portions by the RF energy by different amounts depending on the geometry.

23. The apparatus of claim 1, wherein the RF generator is controlled to provide different powers of the RF energy for achieving different temperatures at different portions of the paste.

* * * * *